(12) United States Patent
Cox et al.

(10) Patent No.: US 7,391,799 B2
(45) Date of Patent: Jun. 24, 2008

(54) MODE SELECTIVE SEMICONDUCTOR MIRROR FOR VERTICAL CAVITY SURFACE EMITTING LASERS

(75) Inventors: James A. Cox, New Brighton, MN (US); Jin K. Kim, St. Louis Park, MN (US); Gyoungwon Park, Allentown, PA (US)

(73) Assignee: Finisar Corporation, Sunnyvale, CA (US)

( * ) Notice: Subject to any disclaimer, the term of this patent is extended or adjusted under 35 U.S.C. 154(b) by 50 days.

(21) Appl. No.: 11/176,615

(22) Filed: Jul. 7, 2005

(65) Prior Publication Data

US 2006/0045146 A1 Mar. 2, 2006

Related U.S. Application Data

(60) Provisional application No. 60/606,184, filed on Aug. 31, 2004.

(51) Int. Cl.
*H01S 5/00* (2006.01)
(52) U.S. Cl. .................... 372/50.1; 372/43.01
(58) Field of Classification Search ............ 372/45.012, 372/50.1, 43.01, 45.01
See application file for complete search history.

(56) References Cited

U.S. PATENT DOCUMENTS

| | | | |
|---|---|---|---|
| 5,389,797 A * | 2/1995 | Bryan et al. | 257/21 |
| 5,903,590 A | 5/1999 | Hadley et al. | |
| 5,940,420 A | 8/1999 | Blair et al. | |
| 5,940,422 A * | 8/1999 | Johnson | 372/45.01 |
| 6,144,682 A * | 11/2000 | Sun | 372/45.01 |
| 6,266,357 B1 * | 7/2001 | Feld et al. | 372/46.01 |
| 6,727,520 B2 | 4/2004 | Morgan et al. | |
| 2003/0026308 A1 | 2/2003 | Iwai et al. | |

OTHER PUBLICATIONS

Heiko J. Unold, et al., *Single-Mode VCSELs*, Vertical-Cavity Surface-Emitting Lasers VI, Chun Lei, Sean P. Kilcoyne, Editors, Proceedings of SPIE, vol. 4649, 2002, pp. 218-228.

C.C. Chen et al., *Stable Single-Mode Operation of an 850-nm VCSEL with a Higher Order Mode Absorber Formed by Shallow Zn Diffusion*, IEEE Phot.Tech.Letters, vol. 11, No. 4, 2001, pp. 266-268.

* cited by examiner

*Primary Examiner*—Minsun Harvey
*Assistant Examiner*—Tuan N. Nguyen
(74) *Attorney, Agent, or Firm*—Workman Nydegger

(57) ABSTRACT

A vertical cavity surface emitting laser with a mode-selective mirror. A filter is formed on the top DBR stack of a VCSEL. The filter includes semiconductor layers that are etch stops for immediately superior layers. The filter is selectively etched to create a first region that is phase matched to the top DBR stack and a second region that is phase mismatched to the top DBR stack. The second region inhibits undesired modes and provides additional absorption for the undesired modes. The first region is formed using a wet-etch process whose etch depth is controlled because the semiconductor layers are etch stops for immediately superior layers.

19 Claims, 3 Drawing Sheets

MODE SELECTIVE SEMICONDUCTOR MIRROR FOR VERTICAL CAVITY SURFACE EMITTING LASERS

CROSS-REFERENCE TO RELATED APPLICATIONS

This application claims the benefit of U.S. Provisional Application Ser. No. 60/606,184, filed on Aug. 31, 2004, which is incorporated herein by reference in its entirety.

BACKGROUND OF THE INVENTION

1. The Field of the Invention

The present invention relates to single mode vertical cavity surface emitting lasers (VCSELs). More particularly, the present invention relates to systems and methods for VCSELs with varying reflectance and absorption across the VCSELs aperture.

2. Background and Relevant Art

Vertical cavity surface emitting lasers are continuing to evolve and are becoming increasingly useful in many applications. Because VCSELs emit from a direction perpendicular to the active region, they are well suited for low-cost wafer-scale fabrication. They are also suitable for array applications.

VCSELs typically have a short cavity length which implies that there is limitations on the relationship between the cavity resonance and the gain bandwidth. VCSELs may only have a single longitudinal mode. However, the cavity diameter of a VCSEL is relatively large and may permit more than one transverse spatial modes. In other words, VCSELs may be multi-mode devices. In a wide variety of applications, it is desirable to have a single mode output. The challenge faced today is the ability to reliably manufacture a VCSEL that is single mode.

BRIEF SUMMARY OF THE INVENTION

These and other limitations are overcome by embodiments of the invention, which relate to vertical cavity surface emitting lasers (VCSELs) that operate in a single mode. In one embodiment of the invention, a filter is formed on a VCSEL by adding semiconductor films to the top of a VCSEL. The semiconductor films or layers, in one embodiment, to the top DBR stack of the VCSEL. The semiconductor films or layers added to the VCSEL are selected such that at least one layer is an etch stop for superior layers.

Because some of the semiconductor layers are etch stops, the semiconductor layers can be etched in a controlled manner. The semiconductor layers can be etched, for example, to implement a radially varying reflectance and absorption across the VCSEL aperture. By selectively etching the semiconductor layers, an outer annular zone can be formed that is phase mismatched to the DBR mirror and that provides additional absorption. The etched inner central zone is phase matched. Etching the filter in this manner leads to the emission of a fundamental single mode.

In one embodiment a layer of GaAs is formed on the top DBR stack and followed by a layer of AlGaAs and another layer of GaAs. The AlGaAs is an etch stop for the top most layer of GaAs and the layer of GaAs underneath the layer of AlGaAs is an etch stop for he AlGaAs layer. Thus, the top most layer of GaAs and the next layer of AlGaAs can be selectively etched to form an inner central zone phase matched to the DBR stack and an outer annular zone phase mismatched to the DBR stack. The thickness of the levels of the layers in the filter can vary. However, the etched layers typically have a thickness related to a quarter wave of the emission wavelength.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features of the invention can be obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

The present invention relates to vertical cavity surface emitting lasers (VCSELs). VCSELs generate laser light by injecting current into an active region where stimulated emission occurs. Even though current is injected into the active region, a VCSEL does not lase unless the active region is bounded by mirror layers that provide relatively high reflectivity. VCSELs often require that the mirror layers have a reflectivity of greater than 99%.

The required reflectivity is typically achieved using distributed Bragg reflector (DBR) layers that are formed both above and below the active region. As light is reflected back and forth through the active region by the DBR layers, the VCSEL eventually lases at the desired wavelength. As previously described, it is often useful to ensure that the VCSEL emits a single mode and embodiments of the invention provide a VCSEL that operates in a fundamental single mode, is manufacturable and reliable.

Generally stated, embodiments of the invention add one or more additional layers or films to the top DBR mirror layers of a VCSEL to form a filter. The additional films are typically lattice matched to the DBR mirror layers. By selectively etching an inner central zone of the additional layers, an outer annular zone is formed. The annular zone is phase mismatched to the DBR and provides, in one example, destructive interference that contributes to the emission of a fundamental single mode. The annular zone also provides additional absorption of undesirable modes.

To form the central inner zone, a wet-etch process is applied. The materials used to form the additional layers or films are etch stop layers for the immediately superior layers. Advantageously, the etch depth can be controlled because the underlying layers are etch stops, leading to single mode VCSELs with higher reliability. In some embodiments, the layers added to the top layers of the VCSEL are typically lattice matched semiconductor materials. This minimizes stress and leads to greater reliability.

Figure 1:
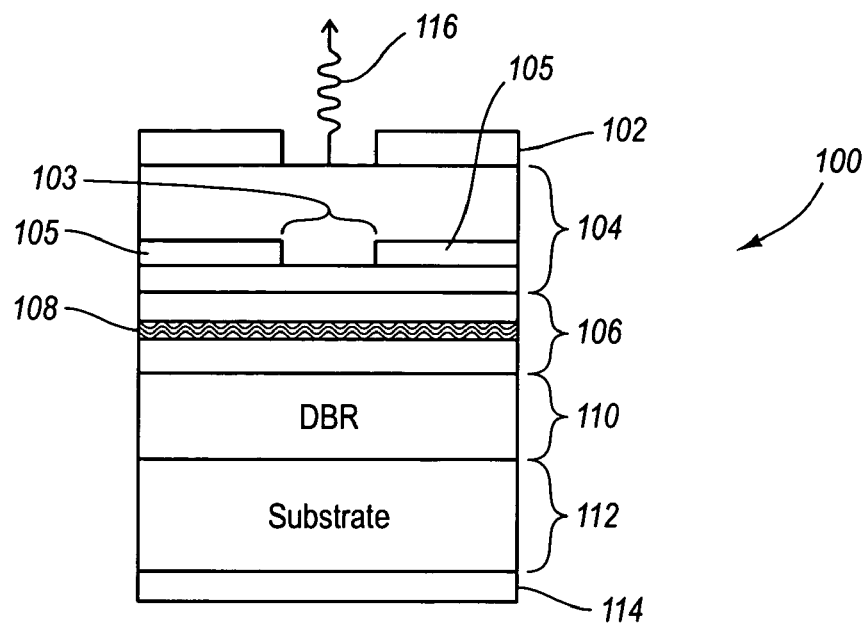
FIG. 1 illustrates one embodiment of a vertical cavity surface emitting laser.

FIG. 1 illustrates a typical structure of a VCSEL 100. The VCSEL 100 includes a substrate 112 with a contact 114 formed thereon. DBR layers 110 form a lower mirror structure for the VCSEL 100 and are arranged over the substrate 112. The VCSEL 100 also includes DBR layers 104. An active region 106 is arranged between the DBR layers 104 and the DBR layers 110. The active region 106 typically includes quantum wells 108 or other gain medium.

In this example, an aperture 103 is formed by oxidized portions 105. Selected layers included in the DBR layers 104 (and the DBR layers 110 in some instances) are oxidized. Alternatively, aperture 103 may be formed implanting protons in the portions 105. A current is injected into the active region 106 using the contacts 102, 114 to establish a potential. The portions 105 tend to force the current through the aperture 103. When the current threshold is reached, the laser lases. As previously stated, the laser may emit more than one mode.

Figure 2:
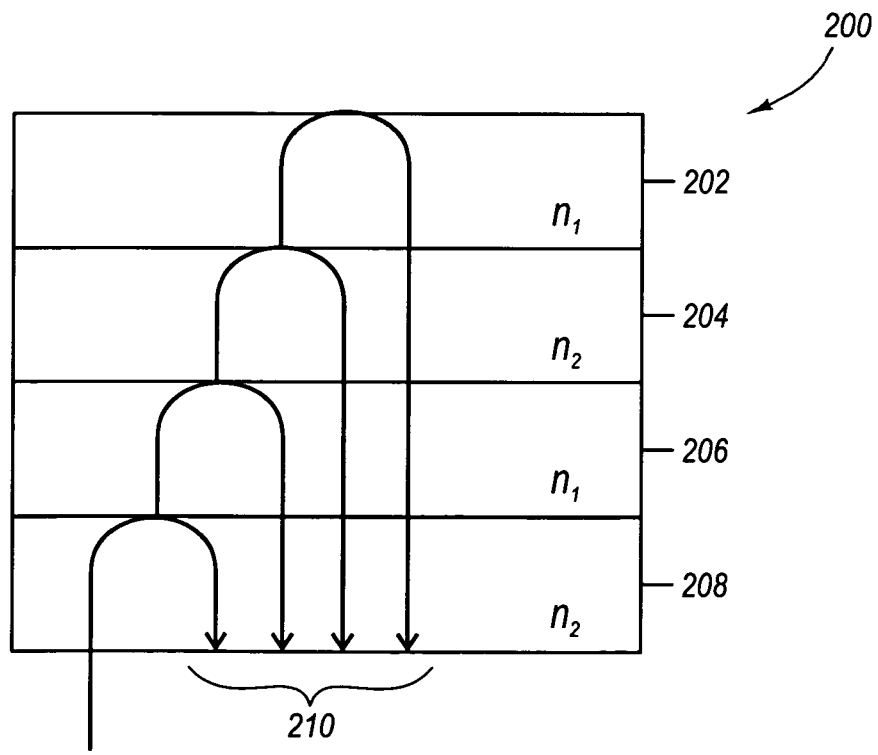
FIG. 2 illustrates the constructive interference achieved in a DBR stack of a vertical cavity surface emitting laser.

FIG. 2 illustrates an embodiment of the DBR layers typically used in VCSELs. DBR layers are typically formed in pairs from two materials that have different refractive indexes. In this example, the layer 202 and 204 form one pair and the layers 206 and 208 form a second pair that is substantially the same as the first pair. The layers 202 and 206 have the same refractive index $n_1$ and the layers 204 and 208 have the refractive index $n_2$.

In the DBR layers 200, the interfaces between adjacent layers reflect light and each interface has a particular reflectivity. The composition and/or the doping (if any) at the interfaces can be graded. In order to achieve the reflectivity necessary for VCSELs, a relatively large number of pairs are typically needed. The layers are formed such that the reflections at the interfaces constructively interfere. The thickness of each pair of individual layers is usually a quarter wave and related to the refractive index. Thus the period of the DBR layers is a half wave. The reflections 210 illustrate that the light has constructive interference.

Figure 3:
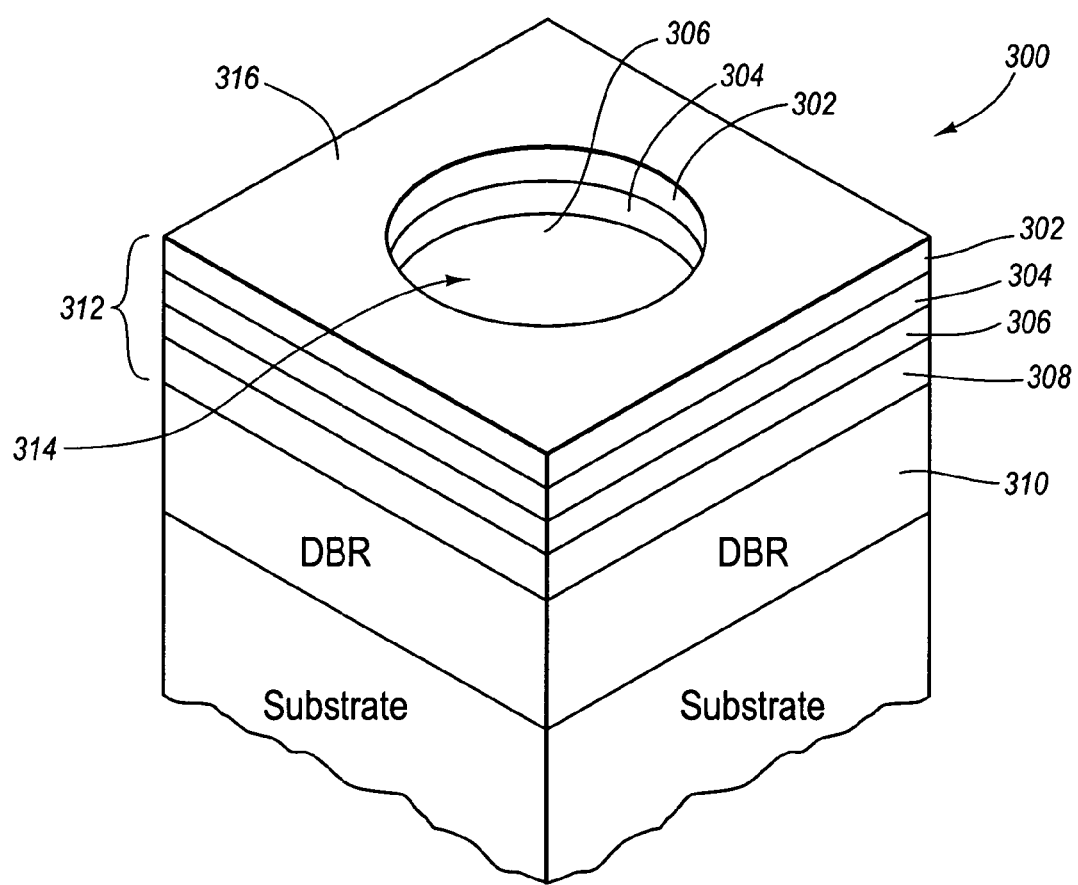
FIG. 3 is a perspective view of one embodiment of a vertical cavity surface emitting laser with a filter formed thereon that includes an inner central zone surrounded by an annular outer zone.

FIG. 3 illustrates a perspective view of one embodiment of a VCSEL in accordance with the present invention. In this example, the semiconductor films or layers are formed on a top DBR stack 310 of a VCSEL 300 to form a filter 312. The composition of the semiconductor layers in the filter 312 are formulated, in this example, to form a natural etch stop for the superior semiconductor layer. In this example, the layer 304 is a natural etch stop for the layer 302 and the layer 306 is a natural etch stop for the layer 304. This enables accurate etch depth control using a wet-etch process. The ability to control the etch depth is instrumental in maintaining a proper phase difference.

In this example, the layer 302 has been etched through to the layer 304, which has been etched to the layer 306. Etching the layers 302 and 304 forms an outer annular zone 316 and an inner central zone 314. The filter 312 thus provides a radially varying reflectance and absorption. More particularly, the outer annular zone 316 is phase mismatched to the DBR stack 310, thereby reducing reflectivity and increasing absorption. The inner central zone 314 is phase matched to the DBR stack 310 and enables the VCSEL 300 to operate in a single mode.

Figure 4A:
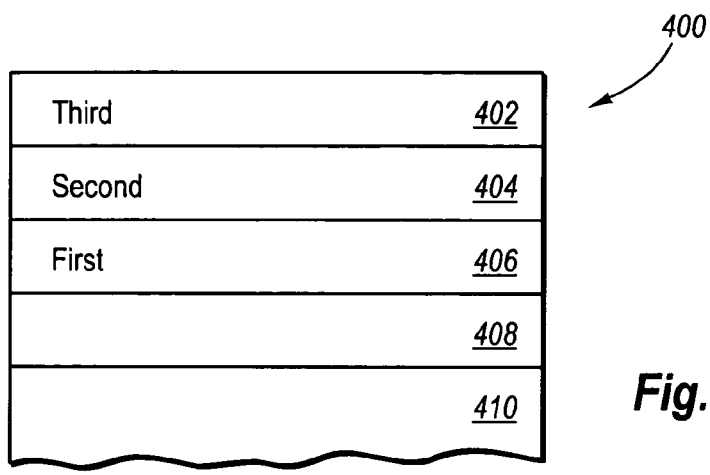
FIGS. 4A, 4B, and 4C illustrate an example of a method for forming a filter and selectively etching the filter to form the inner central zone and annular outer zone illustrated in FIG. 3.
Figure 4B:
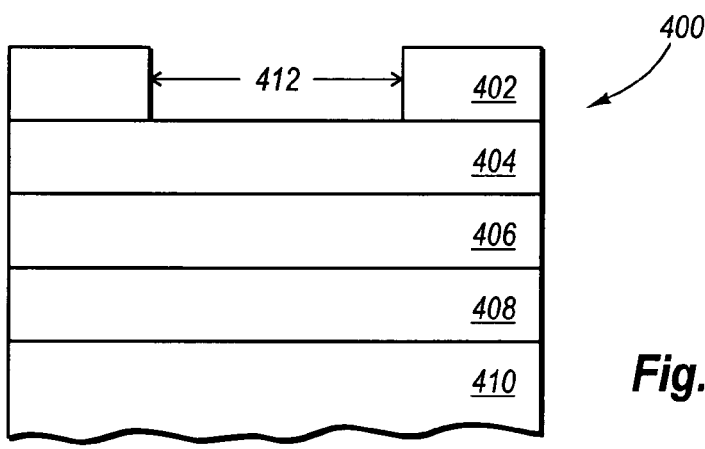
Figure 4C:
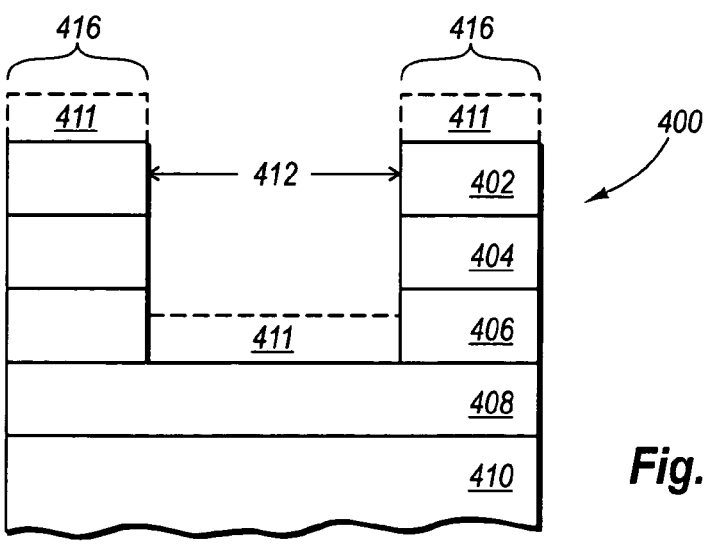

FIGS. 4A, 4B and 4C illustrate an exemplary method for forming a mode selective semiconductor mirror for a VCSEL. FIGS. 4A, 4B, and 4C further illustrate one embodiment of a method for forming a filter such as the filter 312 in FIG. 3. FIG. 4A illustrates a VCSEL 400 that has semiconductor layers 402, 404, 406, and 408 arranged over a DBR stack 410. In one embodiment, the layer 402 is GaAs, the layer 404 is AlGaAs, the layer 406 is GaAs, and the layer 408 is AlGaAs. The In this example, photo resist (PR) is applied and developed to expose the inner central zone. As illustrated in FIG. 4B, the layer 402 is then wet etched using, for example, citric acid. The wet-etch of the layer 402 stops naturally at the layer 404. Next, as illustrated in FIG. 4C, the layer 404 removed using a wet-etch in $HF/H_2O/traceH_2O_2$. The VCSEL 400 may then be encapsulated with a half-wave of a dielectric 411 such as $SiO_2$ or $Si_xN_y$.

In one example, the layer 406 is a top cap layer of the VCSEL 400 and has a thickness on the order of 20 nm. The layers 404 and 402 may be formed, respectively, of AlGaAs and GaAs. The thickness of the layers 404 and 402 can be varied and a selected, in one embodiment, such that the cumulative thickness of the layers 404 and 402 is on the order of a quarter wave.

For example, the following table illustrates various embodiments of a filter that includes the layers 402 and 404 in terms of layer thickness.

|  | Design 1 | Design 2 | Design 3 |
| --- | --- | --- | --- |
| Layer 402 | 35 nm GaAs | 20 nm GaAs | 15 nm GaAs |
| Layer 404 | 20 nm AlGaAs | 36.5 nm AlGaAs | 47.1 nm AlGaAs |
| Layer 406 | 20 nm GaAs | 20 nm GaAs | 20 nm GaAs |

After accounting for refractive index, the cumulative thickness of the layers 402, 404 is a quarter wave. In Design 1, the layer 402 is thicker than the layer 406. In design 2, the layer 402 is about the same thickness as the layer 406. In design 3, the layer 402 is thinner than the layer 406. The thickness of the layer 404 in each design is adjusted such that the thickness of the layers 402 and 404 is on the order of a quarter wave of the emission wavelength.

In each design, the annular outer zone 416 (shown in FIG. 4C) introduces a destructive component into the reflectivity of the VCSEL for the annular area surrounding the inner central zone 412. The inner central zone 412 has been etched as previously described and therefore does not introduce a destructive component into the reflectivity. As a result, the VCSEL 400 may operate in a single mode.

In each design, the composition of each element or other characteristic of each layer can be varied to control the refractive index of each layer. For example, the refractive index of each semiconductor layer in the filter can be controlled.

In general, the semiconductor layers of the filter can be selectively etched to form first and second regions. The first region is phase matched to the top DBR stack and the second region is typically phase mismatched to the top DBR stack. As previously described, the second region introduces reduced reflectivity and increased absorption of undesired modes, both of which contribute to the emission of a fundamental single mode. The etch pattern can vary and results in variations on the semiconductor fetch. Both the first region and the second region may or may not be contiguous on the surface of the VCSEL.

For example, the first region may surround the second region and vice versa. Alternatively, either the first region of the second region may be contained within the other region.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A vertical cavity surface emitting laser (VCSEL) with a mode selective semiconductor mirror, the VCSEL comprising:
   an active region formed between a bottom DBR stack and a top DBR stack;
      a first semiconductor layer of a III/V semiconductor material formed on the top DBR stack;
      a second semiconductor layer of an aluminum containing III/V semiconductor material formed on the first semiconductor layer, wherein the first semiconductor layer is an etch stop for the second semiconductor layer;
      a third semiconductor layer of a III/V semiconductor material formed on the second semiconductor layer, wherein the second semiconductor layer is an etch stop for the third semiconductor layer;
      wherein the second semiconductor layer and the third semiconductor layer are selectively etched to form an inner central zone surrounded by an annular outer zone wherein the annular zone is phase mismatched to the top DBR stack and provides a radially varying reflectance and absorption to the VCSEL and wherein the second semiconductor layer and the third semiconductor layer have a cumulative thickness of about a quarter wavelength.

2. A vertical cavity surface emitting laser as defined in claim 1, wherein the first semiconductor layer is a top cap.

3. A vertical cavity surface emitting laser as defined in claim 1, wherein: the first semiconductor layer is GaAs; the second semiconductor layer is AlGaAs; and the third semiconductor layer is GaAs.

4. A vertical cavity surface emitting laser as defined in claim 1, wherein the third semiconductor layer and the second semiconductor layer have a cumulative thickness related to a quarter wave of an emission wavelength.

5. A vertical cavity surface emitting laser as defined in claim 1, wherein the third semiconductor layer is thicker than the first semiconductor layer.

6. A vertical cavity surface emitting laser as defined in claim 1, wherein the third semiconductor layer is thinner than the first semiconductor layer.

7. A method for forming a mode selective vertical cavity surface emitting laser, the method comprising:
   forming a first semiconductor layer of a III/V semiconductor material on a top DBR stack of a vertical cavity surface emitting laser;
   forming a second semiconductor layer of an aluminum containing III/V semiconductor material on the first semiconductor layer;
   forming a third semiconductor layer of a III/V semiconductor material on the second semiconductor layer, wherein the second semiconductor layer is an etch stop for the third semiconductor layer and the first semiconductor layer is an etch stop for the second semiconductor layer; and
   etching the second and third semiconductor layers to form an inner central zone surrounded by an outer zone, wherein the outer zone is phase mismatched to the top DBR stack and wherein the second semiconductor layer and the third semiconductor layer have a cumulative thickness of about a quarter wavelength of an emission wavelength.

8. A method as defined in claim 7, wherein forming a first semiconductor layer further comprises forming a top cap layer.

9. A method as defined in claim 8, wherein the top cap layer is GaAs.

10. A method as defined in claim 7, wherein the second semiconductor is AlGaAs and the third semiconductor layer is GaAs.

11. A method as defined in claim 7, further comprising forming a dielectric structure on the third semiconductor layer, the dielectric structure having a thickness related to a half wave.

12. A method as defined in claim 7, wherein forming a third semiconductor layer further comprises forming a third semiconductor layer that is thinner than the first semiconductor layer.

13. A method as defined in claim 7, wherein forming a third semiconductor layer further comprises forming a third semiconductor layer that is thicker than the first semiconductor layer.

14. A method as defined in claim 7, wherein the outer zone formed by the second semiconductor layer and the third semiconductor layer provide a radially varying reflectance and increased absorption to facilitate emission of a single mode.

15. A method as defined in claim 7, further comprising applying photo resist to expose a region to be etched that corresponds to the inner central zone.

16. A vertical cavity surface emitting laser comprising:
   an active region bounded by a bottom DBR stack and a top DBR stack; and
   a filter formed on the top DBR stack, the filter having a first region that is phase matched to the top DBR stack and a second region that is phase mismatched to the top DBR stack, the filter comprising:
   a first semiconductor layer of a GaAs material having a first thickness; a second semiconductor layer of an AlGaAs material having a second thickness; and a third semiconductor layer of a GaAs material having a third thickness, the third thickness being less that the second thickness, wherein the first, second, and third semiconductor layers are lattice matched; and a dielectric layer formed on the filter and having a thickness related to a half wave.

17. A vertical cavity surface emitting laser as defined in claim 16, wherein a cumulative thickness of the second thickness and the third thickness is related to a quarter wave of an emission wavelength.

18. A vertical cavity surface emitting laser as defined in claim 16, wherein the first region is an inner central zone and the second region is an annular outer zone that surrounds the inner central zone.

19. A vertical cavity surface emitting laser as defined in claim 16, wherein a dielectric layer is on the first semiconductor layer within the central region and on the third semiconductor layer within the annular region.

* * * * *

UNITED STATES PATENT AND TRADEMARK OFFICE
CERTIFICATE OF CORRECTION

PATENT NO. : 7,391,799 B2  Page 1 of 2
APPLICATION NO. : 11/176615
DATED : June 24, 2008
INVENTOR(S) : Cox et al.

It is certified that error appears in the above-identified patent and that said Letters Patent is hereby corrected as shown below:

Drawings
Sheet 2, replace FIG. 3 with the figure depicted below, wherein the label 308, which is never mentioned, is removed.

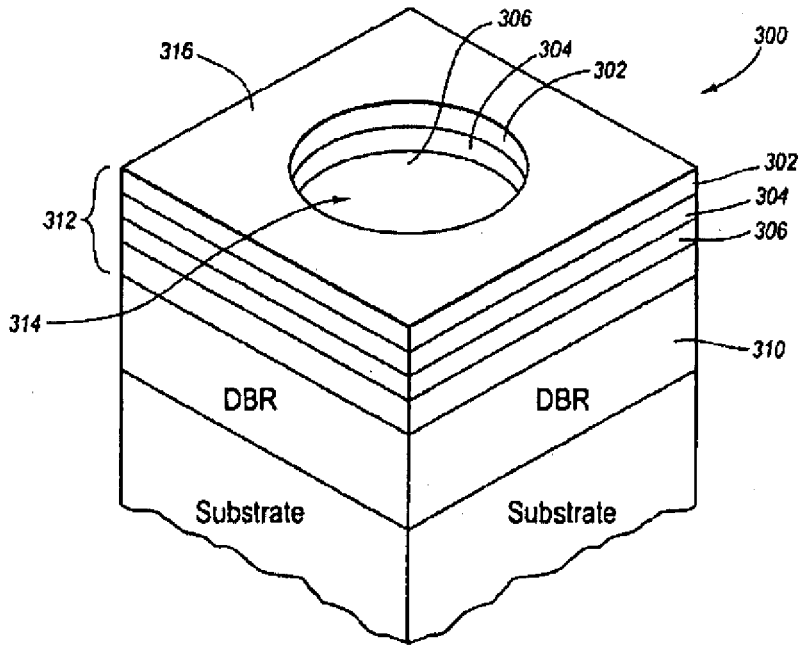

Fig. 3

Signed and Sealed this

Thirtieth Day of November, 2010

David J. Kappos
*Director of the United States Patent and Trademark Office*

Column 1
Line 55, change "phase mismatched" to --phase-mismatched--
Line 56, change "phase matched" to --phase-matched--
Line 61, change "top most" to --top-most--
Line 63, change "top most" to --top-most--
Line 65, change "phase matched" to --phase-matched--
Line 66, change "phase mismatched" to --phase-mismatched--

Column 2
Line 63, change "lattice matched" to --lattice-matched--

Column 3
Line 10, change "lattice matched" to --lattice-matched--
Line 28, change "lases." to --lases 116.--

Column 4
Line 11, remove [The]
Line 62, change "phase matched" to --phase-matched--
Line 63, change "phase mismatched" to --phase-mismatched--

Column 5
Line 1, change "semiconductor fetch" to --semiconductor etch--

Column 6
Line 5, change "etching the second and third semiconductor layers to form an inner central zone surrounded by an outer zone, wherein the outer zone is phase mismatched to the top DBR stack and wherein the second semiconductor layer and the third semiconductor layer have a cumulative thickness of about a quarter wavelength of an emission wavelength" to --etching the second semiconductor layer using a first etchant and etching the third semiconductor layer using a second and different etchant to form an inner central zone surrounded by an outer zone, wherein the outer zone is phase mismatched to the top DBR stack and wherein the second semiconductor layer and the third semiconductor layer have a cumulative thickness of about a quarter wavelength of an emission wavelength--
Line 41, change "having a first region" to --having a first central region--
Line 43, change "second region that is phase mismatched" to --second annular region that is positioned above and radially to the central region and is phase mismatched--
Line 45, change "a first semiconductor layer of a GaAs material having a first thickness; a second semiconductor layer of an AlGaAs material having a second thickness; and a third semiconductor layer of a GaAs material having a third thickness, the third thickness being less that the second thickness, wherein the first, second, and third semiconductor layers are lattice matched; and a dielectric layer formed on the filter and having a thickness related to a half wave" to --a first semiconductor layer of a GaAs material positioned within the central region and having a first thickness; a second semiconductor layer of an AlGaAs material positioned within the annular region and having a second thickness; and a third semiconductor layer of a GaAs material positioned within the annular region and having a third thickness, the third thickness being less than the second thickness, wherein the first, second, and third semiconductor layers are lattice matched; and a dielectric layer formed on the filter and having a thickness related to a half wave.--